United States Patent
Agarwala et al.

(10) Patent No.: US 6,271,599 B1
(45) Date of Patent: Aug. 7, 2001

(54) WIRE INTERCONNECT STRUCTURE FOR ELECTRICALLY AND MECHANICALLY CONNECTING AN INTEGRATED CIRCUIT CHIP TO A SUBSTRATE

(75) Inventors: Birendra N. Agarwala, Hopewell Junction; William H. Ma, Fishkill, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/366,145

(22) Filed: Aug. 3, 1999

(51) Int. Cl.[7] .................................................. H01L 23/04
(52) U.S. Cl. .......................... 257/782; 257/780; 257/673; 257/737; 257/738
(58) Field of Search .................................... 257/673, 780, 257/737, 738, 782

(56) References Cited

U.S. PATENT DOCUMENTS

| | | |
|---|---|---|
| 5,334,804 | 8/1994 | Love et al. . |
| 5,554,887 * | 9/1996 | Sawai et al. .......................... 257/737 |
| 5,640,047 * | 6/1997 | Nakashima ............................ 257/738 |
| 5,773,889 | 6/1998 | Love et al. . |
| 5,949,141 * | 9/1999 | Farnworth et al. ................... 257/737 |
| 6,097,087 * | 8/2000 | Farnworth et al. ................... 257/737 |
| 6,108,210 * | 8/2000 | Chung ................................... 257/249 |
| 6,141,497 * | 10/2000 | Reinicke et al. ....................... 251/11 |

* cited by examiner

Primary Examiner—Fetsum Abraham
(74) Attorney, Agent, or Firm—Ratner & Prestia; Tiffany L. Townsend, Esq.

(57) ABSTRACT

A wire interconnect structure for electrically and mechanically connecting an integrated circuit chip to a substrate and a process for manufacturing the same. The wire interconnect structure comprises an insulator layer disposed on an integrated circuit chip and an electrically conductive post extending through the insulator layer to the integrated circuit chip. The post has an elongated body, a bottom at one end of the body which is mechanically and electrically connected to the integrated circuit chip, and a top having a spherical shape at the opposite end of the body which extends outward from the insulator layer.

11 Claims, 2 Drawing Sheets

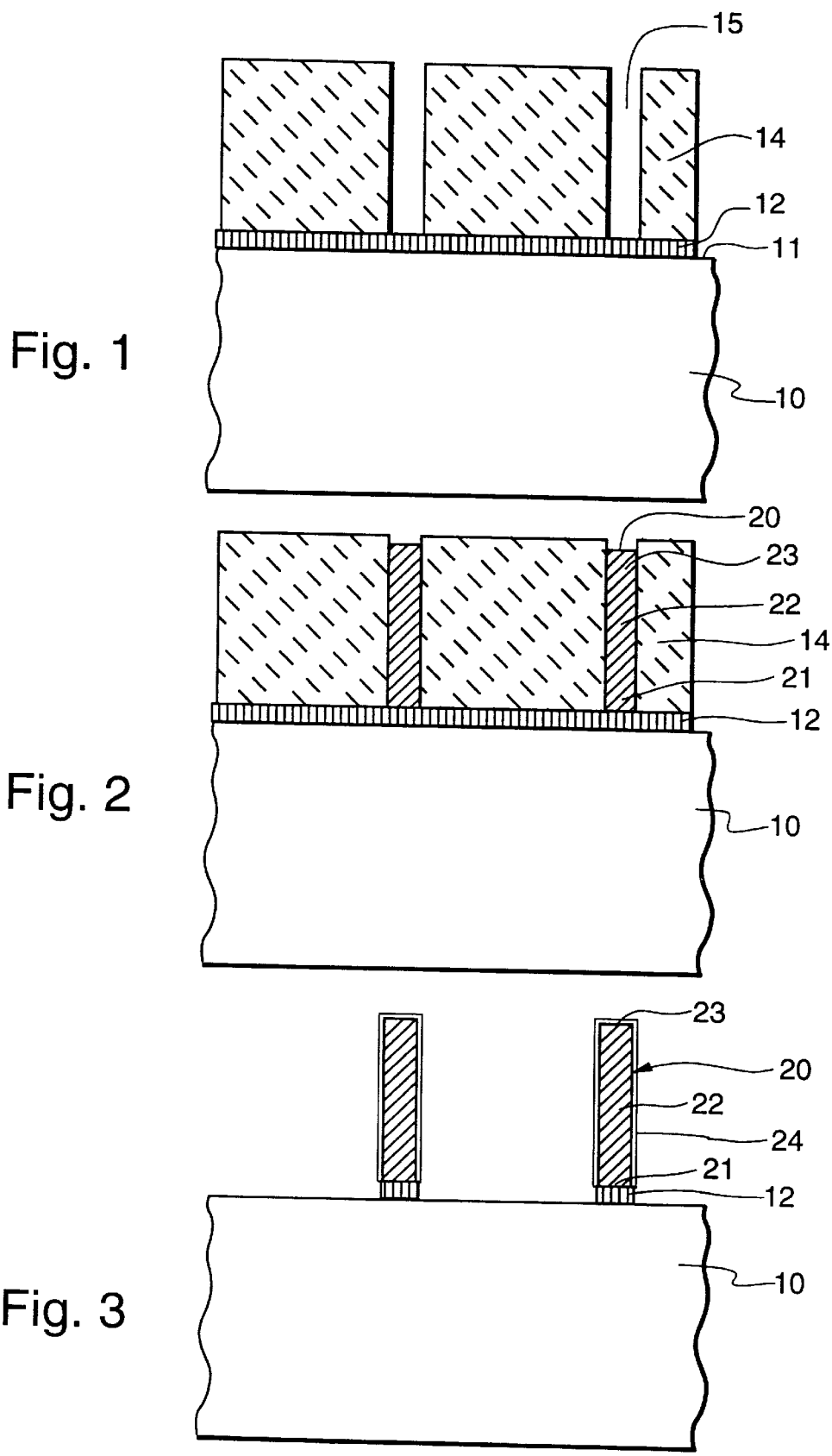

WIRE INTERCONNECT STRUCTURE FOR ELECTRICALLY AND MECHANICALLY CONNECTING AN INTEGRATED CIRCUIT CHIP TO A SUBSTRATE

TECHNICAL FIELD

The present invention relates to a wire interconnect structure for electrically and mechanically connecting an integrated circuit (IC) chip to a substrate and to a process of manufacturing the structure.

BACKGROUND OF THE INVENTION

Various mechanisms are known for electrically and mechanically connecting (or coupling) an integrated circuit to a supporting substrate (or major substrate). A common arrangement used for this purpose has solder bumps disposed on the IC chip and the supporting substrate in a corresponding relationship such that the surfaces of the chip and substrate are parallel. An example of this arrangement is the Controlled Collapsed Chip Connection process, which is abbreviated as the "C-4" or "$C^4$" process. The chip may be mounted to the supporting substrate such that the active surface of the chip, i.e., the structure which has the integrated components, faces away from the substrate or faces towards the substrate ("flip-chip"). In the first case, the signal and power lines from the active surface of the chip are brought to the periphery of the chip, and then connected to the supporting substrate by wirebonds or Tape Automated Bonding ("TAB") circuits. In the latter case of a "flip-chip" orientation, conductive pads on the active surface of the IC chip contact solder bumps on the supporting substrate.

Flip-chip bonding generally permits a greater density of interconnects per chip than other bonding approaches. The IC chip is bonded to the supporting substrate and the components are held together by the fusing of corresponding solder bumps. The dimension of such a solder bump is typically 80 microns high and 125 microns in diameter. In bonding, two opposing solder bumps are brought into registration and fused together to form a single solder bump spanning between the IC chip and the major substrate. The aspect ratio of the fused solder bump, i.e., the height of the structure divided by its width (diameter), is low, ranging between 1 and 2.

Each of the solder bump connections must be able to withstand the mechanical shearing stresses that are developed by temperature fluctuations and the difference in thermal expansion coefficients between the IC chip and the supporting substrate during operation of the IC chip. Specifically, when the IC chip and the supporting substrate are exposed to elevated temperatures, they will expand at different rates and to different dimensions, thereby inducing mechanical stresses in the solder bump connections. After many thermal cycles or upon large changes in temperature, the fused solder bumps often begin to fatigue and develop cracks. This undesirable development lowers or destroys the electrical conductivity of the fused solder bumps. The cracking usually occurs at the corners of the bases, or ends, of the fused solder bump. The cracking is exacerbated by the low fatigue resistance of solders typically used in IC manufacturing and the low aspect ratio of the fused solder bumps. With regard to the aspect ratio, the shear strain in the solder bump increases as the height of the solder bump decreases, thereby lowering the fatigue resistance capabilities of the joint.

To reduce the thermal stresses, the IC chip and supporting substrate are often constructed from materials having closely matched thermal expansion coefficients so that they expand to substantially the same dimensions when exposed to an elevated temperature. Thermal stresses are still generated each time the IC chip is "powered-up," however, a condition in which a large transient temperature difference between the IC chip and the supporting substrate reaches a temperature near that of the IC chip. Thus, with the high temperatures and power cycling common for high-performance computer chips, solder bumps crack and become mechanically and electrically unreliable even when the IC chip and the supporting substrate have closely matched thermal expansion coefficients. This observation will become a greater problem in the future as computers are designed to dissipate more power in smaller volumes, thereby leading to greater thermal stresses.

Conventional systems require large bonding pad areas, usually 100 microns or more on a side or 100 microns or more in diameter, on the IC chip, on the substrate, or on both components. The large pad areas limit the number of interconnects that can be made to the chip and to the substrate; they also increase the parasitic capacitance of the interconnect. As is known by those skilled in the semiconductor and circuit board industry, the amount of parasitic capacitance of a pad is proportionally related to its area, and the speed at which the interconnect can transmit electrical signals decreases with increasing parasitic capacitance. A modern trend in high-performance computer systems is directed toward increasing the density of chip interconnects and the speed of electrical communications.

Presently, there is a need for a high-density, high-speed wire interconnect structure for electrically and mechanically connecting an integrated circuit to a substrate. There is also a need for a high-density, high-speed wire interconnet structure having improved mechanical and thermal stability. The present invention is directed to filling these needs. Accordingly, one object of the present invention is to provide a wire interconnect structure having a large density of integrated circuit chip interconnects. A related object is to provide a wire interconnect structure having improved mechanical and thermal stability. Still another object of the present invention is to overcome the shortcomings of conventional C-4 interconnect structures.

SUMMARY OF THE INVENTION

To achieve these and other objects, and in view of its purposes, the present invention provides a wire interconnect structure for electrically and mechanically connecting an integrated circuit chip to a substrate. The wire interconnect structure of the present invention comprises an insulator layer disposed on an integrated circuit chip and an electrically conductive post extending through the insulator layer to the integrated circuit chip. The post has an elongated body, a bottom end positioned at one end of the body which is mechanically and electrically connected to the integrated circuit chip, and a top end having a spherical shape positioned at the top end of the body which extends outward from the insulator layer. In a first embodiment, the insulator layer comprises polyimide. In a second embodiment, the insulator layer is selected from a chemical vapor deposition insulator material and a spin-on insulator material.

The present invention also provides a process for manufacturing a wire interconnect structure. A first step of the process comprises forming an electrically conductive post extending from an integrated circuit chip. The post has an elongated body having, a bottom end adjacent the integrated circuit chip and a top end. Next, an insulator layer is formed on the integrated circuit chip and post such that the top end of post is exposed. Following formation of the insulator layer, the top end of the post is reflowed and fluxed such that the top end has a spherical shape.

It is to be understood that both the foregoing general description and the following detailed description are exemplary, but are not restrictive, of the present invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various feature s are arbitrarily expanded or reduced for clarity. Included in the drawing are the following figures:

FIG. 1 shows an integrated circuit chip having a ball limiting metallurgy layer, a mask, and a trench extending through the mask to the ball limiting metallurgy layer;

FIG. 2 shows the structure of FIG. 1 having a post formed in the trench;

FIG. 3 shows the structure of FIG. 2 after the mask has been removed, a portion of the ball limiting layer has been removed, and a support layer has been formed on the post;

DETAILED DESCRIPTION OF THE INVENTION

Figure 4:
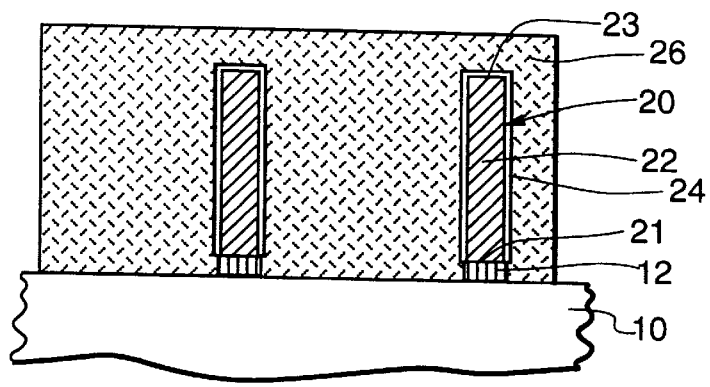
FIG. 4 shows the structure of FIG. 3 further having an insulator layer formed on the integrated circuit chip and post.

The present invention will next be illustrated with reference to the figures in which similar numbers indicate the same elements in all figures. Such figures are intended to be illustrative, rather than limiting, and are included to facilitate the explanation of the apparatus and process of the present invention.

The process of the present invention begins by forming a mask 14 on an integrated circuit chip 10. The mask 14 can be selected from those mask materials conventionally used, such as Riston® made by E. I. DuPont deNemours & Co., Inc. of Wilmington, Del. The mask 14 is formed on the integrated circuit chip 10 using conventional techniques, such as lamination.

Preferably, a ball limiting metallurgy (BLM) layer 12 is formed on the surface 11 of integrated circuit chip 10 before formation of the mask 14. The ball limiting metallurgy layer 12 physically and electrically couples the bottom end of the post (described below) to the integrated circuit chip 10. In addition, the ball limiting metallurgy layer 12 provides an electrical connection to the integrated circuit chip 10. Preferably, the ball limiting metallurgy comprises a titanium tungsten layer, a chromium layer, a chromium-copper layer, and a copper layer.

Following formation of the mask 14 on the integrated circuit chip 10, the mask 14 is patterned using lithography. A portion of the mask 14 is removed, such as by reactive ion etching (RIE), to form a trench 15 extending into and through the mask 14 to the ball limiting metallurgy layer 12 or to the integrated circuit chip 10 if the ball limiting metallurgy layer 12 is not present. FIG. 1 illustrates the resulting structure.

Figure 7:
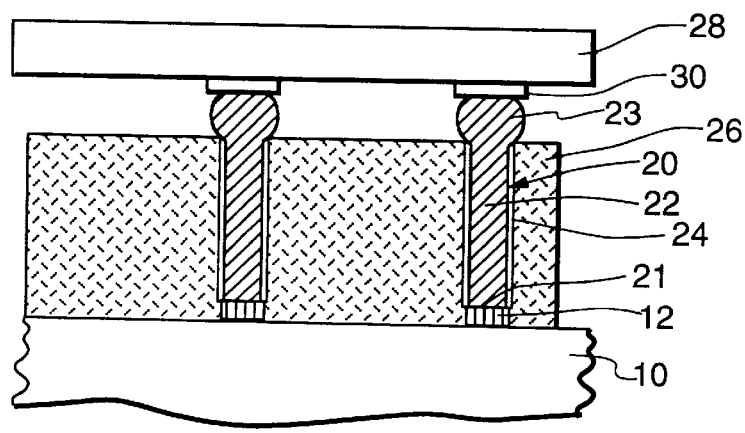
FIG. 7 shows the structure of FIG. 6 after a substrate is mechanically and electrically connected to the integrated circuit chip via a contact pad in contact with the top end of the post.

Following formation of the trench 15, the next step in the process of the present invention is the formation of an electrically conductive post 20 in the trench 15. The post 20 comprises an electrically conductive material for electrically connecting the circuit chip 10 to a substrate 28 as shown in FIG. 7. Alternatively, the integrated circuit chip 10 can be connected to a second integrated circuit chip. Suitable materials for the post 20 include a palladium-tin alloy, palladium-indium alloy, palladium-bismuth alloy, and combinations of these alloys. The post 20 can be made of a uniform solder composition throughout or the post can be made of a high-melt solder composition at the bottom end 21 and a lower melt solder at the top end 23. To form the post 20, the solder alloy is formed in the trench 15 using conventional techniques, such as electroplating. In forming the post 20, the ball limiting metallurgy layer 12, also known as the seed layer, serves as the electrical contact. Alternatively, if the ball limiting metallurgy layer 12 is not used, the integrated circuit chip 10 can serve as an electrical contact.

FIG. 2 illustrates the resulting structure. Preferably, the elongated body 22 of the post 20 has a diameter from about 2 microns to about 24 microns. In addition, the elongated body 22 of the post 20 preferably has a length extending from the top end 23 to the bottom end 21 of about 25 microns to about 250 microns.

In the next step of the process of the present invention, the mask 14 is removed from the integrated circuit substrate. Mask 14 can be removed using conventional techniques, such as dissolution in a chemical solvent. The exposed portion of the ball limiting metallurgy layer 12 (i.e., the portion of the ball limiting metallurgy layer 12 not underlying the post 20) is then removed (if used) by a selective chemical etching process. The portion of the ball limiting metallurgy layer 12 under the post 20 is masked by the post 20 during this etch.

In a preferred embodiment, a support layer 24 is next formed on the surface of the post 20. The addition of the support layer 24 on the post 20 adds mechanical strength and thermal stability to the post 20. The support layer 24 is preferably an oxide or nitride, such as silicon oxide or silicon nitride, having a thickness of about 50 angstroms to about 500 angstroms. The support layer 24 can be formed using conventional techniques, such as chemical vapor deposition. FIG. 3 illustrates the resulting structure.

In the next step of the process of the present invention, an insulator layer 26 is formed on the integrated circuit chip 10. FIG. 4 illustrates the resulting structure. It been discovered that use of an insulator layer 26 provides improved mechanical and electrical coupling of the integrated circuit chip 10 to the substrate 28, such that a greater number of posts 20 having reduced dimensions can be fabricated.

To reduce thermal stresses, the integrated circuit chip 10 and the substrate 28 are often constructed from material having closely matched thermal expansion coefficients so that they expand to substantially the same dimensions when exposed to an elevated temperature. When the thermal coefficients of expansion of the integrated circuit chip 10 and the substrate 28 are closely matched, the insulator material selected for the insulator layer 26 does not require pliability.

As such, conventional insulator materials can be used. Examples of suitable insulators include chemical vapor deposition insulator materials, such as silicon nitride and silicon oxide, and spin-on insulator materials, such as spin-on glass.

When the thermal coefficients of expansion between the integrated circuit chip 10 and the substrate 28 are mismatched, the integrated circuit chip 10 and the substrate 28 do not expand in substantially the same dimensions when exposed to an elevated temperature. As such, a pliable insulator material is used as the insulator layer 26. The pliable insulator layer 26 has the characteristic that it can expand and retract as the post 20 expands and retracts due to thermal changes. The insulator is selected from those materials having pliable characteristics and thermal stability at the solder reflow temperature. Preferably, the insulator layer 26 comprises polyimide or another organic insulator having properties similar to polyimide.

Figure 5:
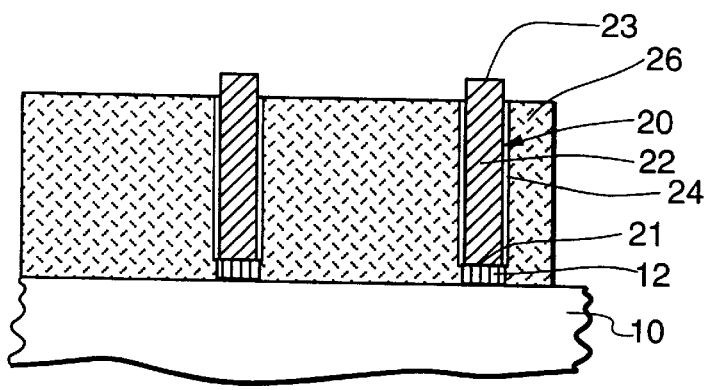
FIG. 5 shows the structure of FIG. 4 after the insulator layer has been partially removed such that the top end of the post is exposed.

Following formation of the insulator layer 26, a portion of the insulator layer 26 is removed such that the top end 23 of the post 20 is exposed. In addition, the portion of the support layer 24 (if included) covering the top end 23 of the post 20 is removed. Removal of the portion of the support layer 24 can be done using conventional techniques, such as reactive ion etching (RIE). FIG. 5 illustrates the resulting structure.

FIGS. 4 and 5 illustrate, respectively, the structures resulting from forming the insulator layer 26 on the integrated circuit chip 10, followed by the removal of a portion of the insulator layer 26 to expose the top end 23 of the post 20. It should be appreciated that the insulator layer 26 can be formed on the integrated circuit chip 10 such that removal of a portion of the insulator layer 26 is not required to expose the top end 23 of the post 20. Thus, at least two process approaches exist to produce the structure illustrated in FIG. 5.

Figure 6:
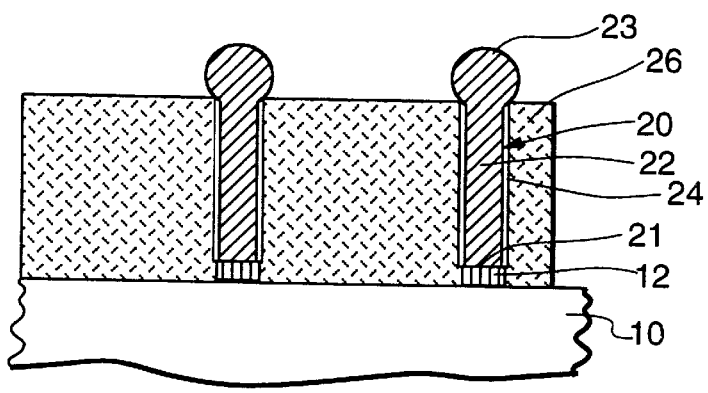
FIG. 6 shows the structure of FIG. 5 after the top end of the post has been reflowed and fluxed such that the top end has a spherical shape.

In the next step of the process of the present invention, a flux is applied to the top end 23 of the post 20 and the integrated circuit chip 10 is heated above the solder melting point, typically from about 20° C. to about 50° C., in a reducing or an inert environment. The top end 23 of the post 20 is subjected to reflow conditions such that the top end 23 melts and forms a spherical shape. The resulting structure is illustrated in FIG. 6. Preferably, the spherical shape of the top end 23 of the post 20 has a diameter of about 5 microns to about 100 microns.

FIG. 7 shows the structure of FIG. 6 after the substrate 28 is mechanically and electrically connected to the integrated circuit chip 10 via a contact pad 30 in contact with the top end 23 of the post 20. The substrate 28 can be a packaging substrate, also known as a "chip carrier," or the substrate 28 can be another integrated circuit chip. The insulator layer 26 is disposed between the substrate 28 and the integrated circuit chip 10. The electrically conductive post 20 extends from the integrated circuit chip 10 to the substrate 28 through the insulator layer 26. The bottom end 21 of the post 20 is mechanically and electrically connected to the integrated circuit chip 10 and the top end 23 of the post 20 is mechanically and electrically connected to the supporting substrate 28.

Although illustrated and described above with reference to specific embodiments, the present invention is nevertheless not intended to be limited to the details shown. Rather, various modifications may be made in the details within the scope and range of equivalents of the claims and without departing from the spirit of the invention.

What is claimed is:

1. A wire interconnect structure for electrically and mechanically connecting an integrated circuit chip to a substrate, said wire interconnect structure comprising:

an electrically conductive post having:
    an elongated body having a first end and a second end, with a length between the first end and the second end, and the length being greater than the diameter of the elongated body;
    a bottom at said first end of said body, said bottom mechanically and electrically connected to said integrated circuit chip; and
    a top at said second end of said body of the same material as and formed from said body and having a spherical shape, and adapted to electrically and mechanically connect to the substrate; and
    an insulator layer disposed on said integrated circuit chip surrounding said post and from which said top of said post projects and of a flexible material that permits said post to flex to accommodate a thermal mismatch between said integrated circuit chip and said substrate.

2. The wire interconnect structure of claim 1 wherein said insulator layer comprises polyimide.

3. The wire interconnect structure of claim 1 wherein said insulator layer is one of a chemical vapor deposition insulator material and a spin-on insulator material.

4. The wire interconnect structure of claim 1 wherein said post is formed of a material selected from the group consisting of a palladium-tin alloy, palladium-indium alloy, palladium-bismuth alloy, and combinations of those alloys.

5. The wire interconnect structure of claim 1 wherein the elongated body of said post has a diameter of about 2 microns to about 50 microns.

6. The wire interconnect structure of claim 1 wherein the elongated body of said post has a length extending from said top to said bottom of about 25 microns to about 250 microns.

7. The wire interconnect structure of claim 1 wherein the spherical shape of said top end has a diameter of about 5 microns to about 100 microns.

8. The wire interconnect structure of claim 1 further comprising a ball limiting metallurgy layer disposed on the bottom of said post, said ball limiting metallurgy layer physically and electrically coupling said post to said integrated circuit chip.

9. The wire interconnect structure of claim 8 wherein said ball limiting metallurgy layer comprises a titanium-tungsten layer, a chromium layer, a chromium-copper layer, and a copper layer.

10. The wire interconnect structure of claim 1 wherein said post has a support layer formed on the body of said post, said support layer extending from the bottom to the top of said post.

11. The wire interconnect structure of claim 10 wherein said support layer comprises an oxide.

* * * * *